United States Patent
Nakamura

(10) Patent No.: US 11,756,709 B2
(45) Date of Patent: Sep. 12, 2023

(54) OXIDE SUPERCONDUCTING WIRE

(71) Applicant: FUJIKURA LTD., Tokyo (JP)

(72) Inventor: Naonori Nakamura, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 17/632,689

(22) PCT Filed: Oct. 6, 2020

(86) PCT No.: PCT/JP2020/037847
§ 371 (c)(1),
(2) Date: Feb. 3, 2022

(87) PCT Pub. No.: WO2021/070810
PCT Pub. Date: Apr. 15, 2021

(65) Prior Publication Data
US 2022/0285051 A1    Sep. 8, 2022

(30) Foreign Application Priority Data

Oct. 9, 2019    (JP) .................... 2019-185983

(51) Int. Cl.
*H01B 12/06*    (2006.01)
*H10N 60/20*    (2023.01)

(52) U.S. Cl.
CPC ........... *H01B 12/06* (2013.01); *H10N 60/203* (2023.02)

(58) Field of Classification Search
CPC .............................. H01B 12/06; H10N 60/203
See application file for complete search history.

(56) References Cited

U.S. PATENT DOCUMENTS

| | | | | |
|---|---|---|---|---|
| 6,803,684 B2* | 10/2004 | Wang | ..................... | H02K 55/04 310/52 |
| 2013/0180860 A1* | 7/2013 | Kamachi | ................ | C25D 7/001 205/291 |
| 2017/0145538 A1* | 5/2017 | Shuto | .................... | B32B 15/043 |
| 2019/0259512 A1* | 8/2019 | Nagaishi | ................... | H01F 6/06 |

FOREIGN PATENT DOCUMENTS

| | | | |
|---|---|---|---|
| JP | 2007-080780 A | 3/2007 | |
| JP | 2015-198015 A | 11/2015 | |
| JP | 2015-198017 A | 11/2015 | |
| JP | 2017-188339 A | 10/2017 | |
| WO | WO 2018/078876 | * 5/2018 | ............. H01B 12/06 |

OTHER PUBLICATIONS

International Search Report issued in corresponding International Application No. PCT/JP2020/037847 dated Nov. 2, 2020 (2 pages).

* cited by examiner

*Primary Examiner* — Paul A Wartalowicz
(74) *Attorney, Agent, or Firm* — Osha Bergman Watanabe & Burton LLP

(57) ABSTRACT

An oxide superconducting wire includes a superconductor laminate including an oxide superconducting layer on at least one surface of a base material, and a plating layer which is included in a stabilizing layer of the superconductor laminate and formed by plating. A surface roughness Ra of the plating layer is 1.0 μm or more and 2.0 μm or less. An entire average crystal grain size of the plating layer is 0.86 μm or more and 3.05 μm or less.

5 Claims, 2 Drawing Sheets

OXIDE SUPERCONDUCTING WIRE

CROSS-REFERENCE TO RELATED APPLICATION

Priority is claimed on Japanese Patent Application No. 2019-185983, filed in Japan on Oct. 9, 2019, the content of which is incorporated herein by reference.

TECHNICAL FIELD

The present invention relates to an oxide superconducting wire.

BACKGROUND ART

A RE123-based oxide superconductor ($REBa_2Cu_3O_y$, RE is a rare earth element) exhibits superconductivity at a temperature (approximately 90K) exceeding a liquid nitrogen temperature (77 K). This oxide superconductor has a feature that the critical current density in a magnetic field is higher than that of other high-temperature superconductors. Therefore, application to coils, power cables, and the like is expected. For example, Patent Document 1 discloses an oxide superconducting wire obtained by forming an oxide superconducting layer and an Ag stabilizing layer on a substrate and then forming a Cu stabilizing layer by electroplating.

Patent Document 1

Japanese Unexamined Patent Application, First Publication No. 2007-80780

It is necessary that an oxide superconducting wire has a tensile strength as a mechanical property. Therefore, it is necessary to ensure the tensile strength of the stabilizing layer formed by plating.

SUMMARY

One or more embodiments of the present invention provide an oxide superconducting wire having an excellent tensile strength of a stabilizing layer.

An oxide superconducting wire according to one or more embodiments of the present invention includes a superconductor laminate including an oxide superconducting layer on at least one surface of a base material, and a plating layer which is included in a stabilizing layer of the superconductor laminate and formed by plating, in which a surface roughness Ra of the plating layer is 1.0 μm or more and 2.0 μm or less, and an average crystal grain size of the plating layer is 0.86 μm or more and 3.05 μm or less.

According to the oxide superconducting wire, it is possible to suppress cracks due to the surface roughness of the plating layer being too large and cracks due to the average crystal grain size of the plating layer being too large. Therefore, it is possible to provide the oxide superconducting wire having an excellent tensile strength of the stabilizing layer.

An average crystal grain size of the plating layer may be less on a side close to an inner surface that is adjacent to the superconductor laminate than an average crystal grain size of the plating layer on a side close to an outer surface that is apart from the superconductor laminate.

According to the oxide superconducting wire, since the average crystal grain size of the plating layer on a side apart from the superconductor laminate is relatively large, a ductility on the side closer to the outer surface is high and a workability such as machinability is improved. Therefore, it is possible to provide the oxide superconducting wire having more excellent practicality.

According to one or more embodiments of the present invention, it is possible to provide an oxide superconducting wire having an excellent tensile strength of the stabilizing layer.

DETAILED DESCRIPTION

Hereinafter, the present invention will be described based on one or more embodiments.

Figure 1:
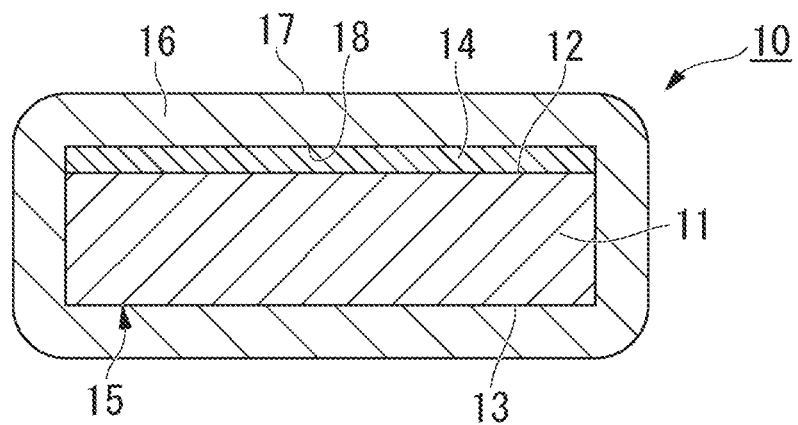
FIG. 1 is a cross-sectional view of an oxide superconducting wire according to one or more embodiments.

FIG. 1 is a cross-sectional view of an oxide superconducting wire according to one or more embodiments.

As shown in FIG. 1, an oxide superconducting wire 10 according to the one or more embodiments includes a plating layer 16 as a stabilizing layer which covers an outer periphery of a superconductor laminate 15. A base material 11 is, for example, a tape-shaped metal base material having each of a first main surface 12 and a second main surface 13 on each of two sides in a thickness direction. FIG. 1 shows an example in which the oxide superconducting layer 14 is formed on the first main surface 12, in a case where the oxide superconducting layer 14 is provided on one surface of the base material 11. The superconductor laminate 15 may include an oxide superconducting layer 14 on at least one surface of the base material 11.

Specific examples of a material constituting the base material 11 include metals such as a nickel alloy typified by Hastelloy (registered trademark), stainless steel, and epitaxial Ni—W alloy in which a texture is introduced into the nickel alloy. In a case where a textured base material in which crystals of metal are aligned and oriented is used as the base material 11, the oxide superconducting layer 14 can be formed directly on the base material 11. The thickness of the base material 11 may be appropriately adjusted according to the purpose, and is, for example, in a range of 10 to 1000 μm.

Although not particularly shown, at least one intermediate layer may be laminated between the base material 11 and the oxide superconducting layer 14. The intermediate layer may have a multi-layer structure, and may include a diffusion prevention layer, a bed layer, a textured layer, a cap layer, and the like in an order from a side close to the base material 11 to a side close to the oxide superconducting layer 14, for example. These layers are not always provided one by one, and some layers may be omitted, or two or more layers of the same layer may be repeatedly laminated. In a case where the textured base material described above is used as the base material 11, the intermediate layer may be omitted.

The diffusion prevention layer has a function of suppressing some components of the base material 11 from diffusing and being mixed as impurities into the oxide superconducting layer 14. The diffusion prevention layer is configured with, for example, $Si_3N_4$, $Al_2O_3$, GZO ($Gd_2Zr_2O_7$), and the like. The thickness of the diffusion prevention layer is, for example, 10 nm to 400 nm.

A bed layer may be formed on the diffusion prevention layer in order to reduce a reaction at an interface between the base material 11 and the oxide superconducting layer 14 and improve an orientation of the layer formed thereon. As a material of the bed layer, $Y_2O_3$, $Er_2O_3$, $CeO_2$, $Dy_2O_3$, $Eu_2O_3$, $Ho_2O_3$, $La_2O_3$, and the like are exemplary examples. The thickness of the bed layer is, for example, 10 nm to 100 nm.

The textured layer is formed of a biaxially textured material to control the crystal epitaxy of the cap layer thereon. The material of the textured layer, a metal oxide such as $Gd_2Zr_2O_7$, MgO, $ZrO_2$—$Y_2O_3$ (YSZ), $SrTiO_3$, $CeO_2$, $Y_2O_3$, $Al_2O_3$, $Gd_2O_3$, $Zr_2O_3$, $Ho_2O_3$, and $Nd_2O_3$, and the like are exemplary examples. This textured layer may be formed by an Ion-Beam-Assisted Deposition (IBAD) method.

The cap layer is formed of a material that is formed on a surface of the textured layer described above and allows crystal grains to self-epitaxy in the in-plane direction. As the material of the cap layer, $CeO_2$, $Y_2O_3$, $Al_2O_3$, $Gd_2O_3$, $ZrO_2$, YSZ, $Ho_2O_3$, $Nd_2O_3$, $LaMnO_3$, and the like are exemplary examples. The thickness of the cap layer is in a range of 50 to 5000 nm.

The oxide superconducting layer 14 is configured with an oxide superconductor. Although, the oxide superconductor is not particularly limited, the oxide superconductor is, for example, a RE-Ba—Cu—O-based oxide superconductor represented by a general formula $REBa_2Cu_3O_{7-x}$ (RE123). As a rare earth element RE, one kind or two or more kinds of Y, La, Ce, Pr, Nd, Sm, Eu, Gd, Tb, Dy, Ho, Er, Tm, Yb, and Lu are exemplary examples. In the general formula of RE123, y is 7-x (oxygen deficiency amount). In addition, the ratio of RE:Ba:Cu is not limited to 1:2:3, and there may be an indefinite ratio. The thickness of the oxide superconducting layer 14 is, for example, approximately 0.5 to 5 μm.

Artificial pins made of different types of materials may be introduced into the oxide superconducting layer 14 as artificial crystal defects. As the different types of materials used for introducing the artificial pins into the oxide superconducting layer 14, at least one or more of $BaSnO_3$ (BSO), $BaZrO_3$ (BZO), $BaHfO_3$ (BHO), $BaTiO_3$ (BTO), $SnO_2$, $TiO_2$, $ZrO_2$, $LaMnO_3$, ZnO, and the like are exemplary examples.

Although not particularly shown, a protective layer may be provided on the oxide superconducting layer 14 (between the oxide superconducting layer 14 and the plating layer 16). The protective layer has functions of bypassing an overcurrent generated in a case of an accident, and suppressing a chemical reaction occurring between the oxide superconducting layer 14 and the plating layer 16. As the material of the protective layer, silver (Ag), copper (Cu), gold (Au), an alloy of gold and silver, other silver alloys, copper alloys, and gold alloys are exemplary examples. The protective layer covers at least the surface of the oxide superconducting layer 14. The thickness of the protective layer is, for example, approximately 1 to 30 μm. In a case where the protective layer is thinned, the thickness thereof may be 10 μm or less. The protective layer can be formed by a vapor deposition method, a sputtering method, or the like.

The plating layer 16 is formed as a stabilizing layer on an outer periphery of the superconductor laminate 15. The stabilizing layer has functions of bypassing the overcurrent generated in a case of an accident, and mechanically reinforcing the oxide superconducting layer 14. The plating layer 16 may be formed over the entire periphery of the superconductor laminate 15. The thickness of the plating layer 16 is not particularly limited, and may be approximately 1 to 300 μm, and may be, for example, 200 μm or less, 100 μm or less, 50 μm or less, and 20 μm or the like. In a case where the plating layers 16 are formed on each of the surfaces of the superconductor laminate 15, the thicknesses of the respective plating layers 16 may be substantially the same or different.

The plating layer 16 can be configured with a metal such as copper (Cu), silver (Ag), or gold (Au). The plating layer 16 can be formed by, for example, electroplating. In a case where the Cu plating layer is formed by electroplating, as a plating bath, a copper sulfate plating bath, a copper cyanide plating bath, a copper pyrophosphate plating bath, and the like are exemplary examples. As the copper sulfate plating solution, an aqueous solution containing copper sulfate pentahydrate, sulfuric acid, additives, and chlorine ions, and the like are generally used.

At least a part of the plating layer 16 can also be formed by electroless plating. In this case, a formaldehyde bath, a glyoxylic acid bath, a hypophosphorous acid bath, a cobalt salt bath, or the like is used. A general formaldehyde bath uses a plating solution containing a cupric salt, a reducing agent (formaldehyde or the like), a complexing agent (Rossel salt or the like), a pH adjuster (sodium hydroxide), and an additive (cyanide).

The plating layer 16 has an outer surface 17 on a surface opposite to the side in contact with the superconductor laminate 15. That is, the plating layer 16 has the surface (outer peripheral surface) 17 and an inner surface 18 in contact with the superconductor laminate 15. In the oxide superconducting wire 10 of the present embodiments, a surface roughness Ra of the plating layer 16 is in a range of 1.0 to 2.0 μm, and the average crystal grain size of the plating layer 16 is in a range of 0.86 to 3.05 μm. Here, the surface roughness Ra of the plating layer 16 may be the surface roughness of the surface (outer peripheral surface) 17.

Accordingly, it is possible to suppress cracks due to the surface roughness of the plating layer 16 being too large and cracks due to the average crystal grain size of the plating layer 16 being too large. Therefore, it is possible to provide the oxide superconducting wire having an excellent tensile strength of the stabilizing layer.

The surface roughness Ra of the plating layer 16 can be measured, for example, as an arithmetic mean roughness Ra specified in JIS B 0601 using a stylus type surface roughness measuring machine for the outer surface 17 of the plating layer 16. As a method of adjusting the surface roughness Ra of the plating layer 16, for example, the current density in electroplating may be changed. In a case where the surface roughness of the plating layer 16 is too large, stress is concentrated on the uneven portion of the surface, and cracks are likely to occur even with a relatively low stress.

The average crystal grain size of the plating layer 16 can be measured, for example, by using a cross-sectional image of the plating layer 16 using a field emission (FE) scanning electron microscope (SEM). In a case of measuring the average crystal grain size by the cutting method, for example, the number of crystal grains that are completely cut by a linear line segment in which a distance from the side where the plating layer 16 is in contact with the superconductor laminate 15 is substantially constant is counted. And a crystal grain size in μm units, which is obtained as the average value of the cutting lengths thereof, can be used.

As a method for adjusting the average crystal grain size of the plating layer 16, at least one or more of conditions for electroplating may be changed. As specific conditions for electroplating, for example, the concentration of a plating solution, the type of a plating bath, the current density, the degree of an overvoltage, the temperature, presence or absence of an additive, presence or absence of a heat treatment after electroplating, and the like are exemplary examples. Although, the additive for the plating bath is not particularly limited, a complexing material, a pH adjuster, a leveler, and the like are exemplary examples. In a case where the average crystal grain size of the plating layer 16 is too large, the ductility of the metal constituting the plating layer 16 is high, but a proof stress (strength) decreases and cracks are likely to occur.

The average crystal grain size of the plating layer 16 may be less on a side close to the inner surface 18 that is adjacent to the superconductor laminate 15 than the average crystal grain size of the plating layer 16 on a side close to the outer surface 17 that is apart from the superconductor laminate 15. In addition, in the plating layer 16, the average crystal grain size in a first region near the inner surface 18 may be smaller than the average crystal grain size in a second region, which is apart from the inner surface 18 than the first region. Since the average crystal grain size of the plating layer 16 on a side apart from the superconductor laminate 15 is relatively large, the ductility on a side close to the outer surface is high and a workability such as machinability is improved. Therefore, it is possible to provide the oxide superconducting wire 10 having more excellent practicality.

In a case of measuring the average crystal grain size of the plating layer 16 on the side close to the inner surface 18 that is adjacent to the superconductor laminate 15, the average crystal grain size measured on a line segment drawn at a predetermined position that is approximately 10% to 20% (for example, 15%) of the thickness of the plating layer 16, from the side of the plating layer 16 in contact with the superconductor laminate 15 may be defined as a representative value. That is, the first region may be a region in which the distance from the inner surface 18 is approximately 10% to 20% (for example, 15%) of the thickness of the plating layer 16.

In addition, in a case of measuring the average crystal grain size of the plating layer 16 on the side close to the outer surface 17 that is apart from the superconductor laminate 15, the average crystal grain size measured on a line segment drawn at a predetermined position that is approximately 80% to 90% (for example, 85%) of the thickness of the plating layer 16, from the side of the plating layer 16 in contact with the superconductor laminate 15 may be defined as a representative value. That is, the second region may be a region in which a distance from the inner surface 18 is approximately 80% to 90% (for example, 85%) of the thickness of the plating layer 16.

The average crystal grain size representing the entire plating layer 16 may be obtained by an arithmetic mean of the following "first to third average crystal grain sizes". (1) The "first average crystal grain size" is the average crystal grain size measured on a line segment drawn at a predetermined position that is approximately 10% to 20% (for example, 15%) of the thickness of the plating layer 16, from the side of the plating layer 16 in contact with the superconductor laminate 15. (2) The "second average crystal grain size" is the average crystal grain size measured on a line segment drawn at a predetermined position that is approximately 45% to 55% (for example, 50%) of the thickness of the plating layer 16, from the side of the plating layer 16 in contact with the superconductor laminate 15. (3) The "third average crystal grain size" is the average crystal grain size measured on a line segment drawn at a predetermined position that is approximately 80% to 90% (for example, 85%) of the thickness of the plating layer 16, from the side of the plating layer 16 in contact with the superconductor laminate 15. These first to third average crystal grain sizes are measured on a line segment parallel to a surface on a side where the plating layer 16 is in contact with the superconductor laminate 15.

Hereinabove, the present invention has been described based on one or more embodiments, but the present invention is not limited to the embodiments described above, and various modifications can be made without departing from the gist of the present invention. As the modification, addition, replacement, omission, and other changes of components in the embodiments are exemplary examples.

In order to ensure electrical insulation from the periphery of the oxide superconducting wire, an insulating tape such as polyimide may be wound around the outer periphery of the oxide superconducting wire, or a resin layer may be formed thereon. An insulating coating layer such as the insulating tape or the resin layer is not essential component, and an insulating coating layer may be appropriately provided depending on the use of the oxide superconducting wire, or a configuration without the insulating coating layer may be provided.

In order to manufacture a superconducting coil using the oxide superconducting wire, for example, the oxide superconducting wire is wound along an outer peripheral surface of a winding frame in the required number of layers to form a coil-shaped multi-layered coil, and then a resin such as an epoxy resin is impregnated to cover the wound oxide superconducting wire to fix the oxide superconducting wire.

Examples

Hereinafter, one or more embodiments of the present invention will be specifically described with reference to Examples.

1. Manufacturing of Oxide Superconducting Wire
   (1-1) As a base material, a base material formed of Hastelloy (registered trademark) C-276 having a width of 12 mm, a length of 10000 mm (10 m), and the thickness of 0.5 mm (500 μm) was prepared.
   (1-2) After polishing a main surface of the base material, the base material was degreased and washed with acetone.
   (1-3) An $Al_2O_3$ layer having a thickness of approximately 100 nm was formed on the main surface of the base material by an ion beam sputtering method.
   (1-4) A $Y_2O_3$ layer having a thickness of approximately 25 nm was formed on a surface of the $Al_2O_3$ layer by the ion beam sputtering method.
   (1-5) A MgO layer having a thickness of 10 nm was formed on a surface of the $Y_2O_3$ layer by an ion beam assisted vapor deposition method.
   (1-6) A $CeO_2$ layer having a thickness of 500 nm was formed on a surface of the MgO layer by a pulse laser vapor deposition method.
   (1-7) A $GdBa_2Cu_3O_7$, layer having a thickness of 2.5 μm was formed as an oxide superconducting layer on a surface of the $CeO_2$ layer by a pulse laser vapor deposition method.
   (1-8) An Ag layer having a thickness of 2 μm was formed on a surface of the oxide superconducting layer by a sputtering method.

(1-9) The superconductor laminate obtained as described above was oxygen-annealed and slit to a width of 4 mm.
(1-10) Cu was formed into a film of 1 to 3 μm on an outer periphery of the superconductor laminate after oxygen annealing by sputtering.
(1-11) A plating layer having a thickness of 20 μm was formed by copper sulfate plating.

For each sample, a type of plating solution was selected from three types of a plating solution A (copper sulfate+chlorine), a plating solution B (copper sulfate+chlorine+leveler), and a plating solution C (copper sulfate pentahydrate+sulfuric acid+hydrochloric acid+additive), a current density was further specified, and an oxide superconducting wire including a Cu plating layer was manufactured.

2. Measurement of Surface Roughness Ra of Plating Layer

The surface roughness Ra of the plating layer was measured regarding the surface of the plating layer in accordance with JIS B 0601.

Figure 2:
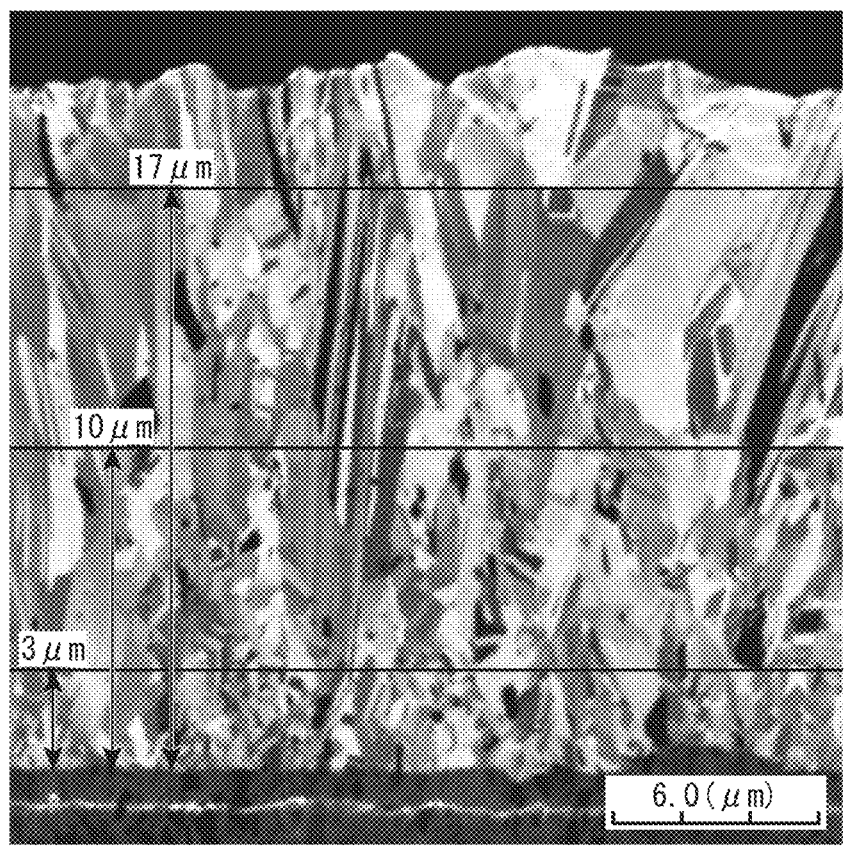
FIG. 2 is a cross-sectional micrograph showing an example of an image used for measuring the average crystal grain size of a plating layer.

3. Measurement of Average Crystal Grain Size of Plating Layer (3-1) The manufactured oxide superconducting wire was cut on a surface perpendicular to a longitudinal direction, a cross section was roughly polished, and then mirror-finished and polished using a buff cloth and 1 μm diamond abrasive grains.
(3-2) A cross section of the polished oxide superconducting wire was immersed in a corrosive liquid for several seconds to etch the exposed surface of the plating layer, and the metal structure of the cross section was exposed (visualized).
(3-3) A cross section of the stabilizing layer was observed with an FE-SEM (field emission scanning electron microscope), and 45 images having a field of view of 23 μm×23 μm were captured for each sample.
(3-4) In each of the captured images, a line segment having a length of 23 μm was drawn at positions of 3 μm, 10 μm, and 17 μm in the thickness direction from a position where the plating layer was in contact with the superconductor laminate. FIG. 2 shows an example of an image in which a line segment is drawn.
(3-5) The number X of crystal grains crossed by each line segment was counted, and an average crystal grain size Y [μm] specified for each line segment was calculated by the following formula.

$Y=23\ [\mu m]/X\ [pieces]$ (3-6) Values of the average crystal grain size Y [μm] measured from 45 images were averaged for each sample, and the average crystal grain size was calculated for each sample.

The average crystal grain size at the "3 μm position" of the plating layer was obtained by averaging values of 45 average crystal grain sizes Y [μm] calculated on a line segment drawn at the position of 3 μm in the thickness direction from the position in which the plating layer is in contact with the superconductor laminate.

The average crystal grain size at the "10 μm position" of the plating layer was obtained by averaging values of 45 average crystal grain sizes Y [μm] calculated on a line segment drawn at the position of 10 μm in the thickness direction from the position in which the plating layer is in contact with the superconductor laminate.

The average crystal grain size at the "17 μm position" of the plating layer was obtained by averaging values of 45 average crystal grain sizes Y [μm] calculated on a line segment drawn at the position of 17 μm in the thickness direction from the position in which the plating layer is in contact with the superconductor laminate.

The average crystal grain size at the "entire" plating layer was obtained by averaging values of 135 average crystal grain sizes Y [μm] in total calculated on each of line segments drawn at the positions of 3 μm, 10 μm, and 17 μm in the thickness direction from the position in which the plating layer is in contact with the superconductor laminate.

4. Tensile Test of Oxide Superconducting Wire

After applying a tensile force (stress) of 500 MPa in the longitudinal direction of the oxide superconducting wire, the surface of the plating layer was visually observed to confirm the presence or absence of cracks. In Table 1, in a case where there was no crack, it was evaluated as "OK", and in a case where there was a crack, it was evaluated as "NG". In addition, in FIG. 3, a sample without cracks is indicated as "O", and a sample with cracks is indicated by "x".

5. Summary

Table 1 shows the types of plating solutions, the surface roughness Ra, the average crystal grain size, and results of the tensile test. In addition, FIG. 3 shows a graph showing the presence or absence of cracks, with a value of surface roughness Ra [μm] as a horizontal axis and a value of average crystal grain size [μm] as a vertical axis.

TABLE 1

| Sample | Plating Solution | Surface roughness Ra [μm] | Average crystal grain size [μm] | | | | Result of tensile test |
|---|---|---|---|---|---|---|---|
| | | | Position of 3 μm | Position of 10 μm | Position of 17 μm | Entire | |
| 1 | A | 2.5 | 0.75 | 1.06 | 1.36 | 1.06 | NG |
| 2 | A | 2.0 | 0.75 | 1.06 | 1.36 | 1.06 | OK |
| 3 | B | 1.3 | 0.68 | 1.04 | 1.13 | 0.95 | OK |
| 4 | B | 3.8 | 3.95 | 4.49 | 5.00 | 4.48 | NG |
| 5 | B | 0.8 | 3.95 | 4.49 | 5.00 | 4.48 | NG |
| 6 | C | 1.0 | 0.83 | 0.87 | 0.88 | 0.86 | OK |
| 7 | C | 2.0 | 2.75 | 3.00 | 3.40 | 3.05 | OK |

Figure 3:
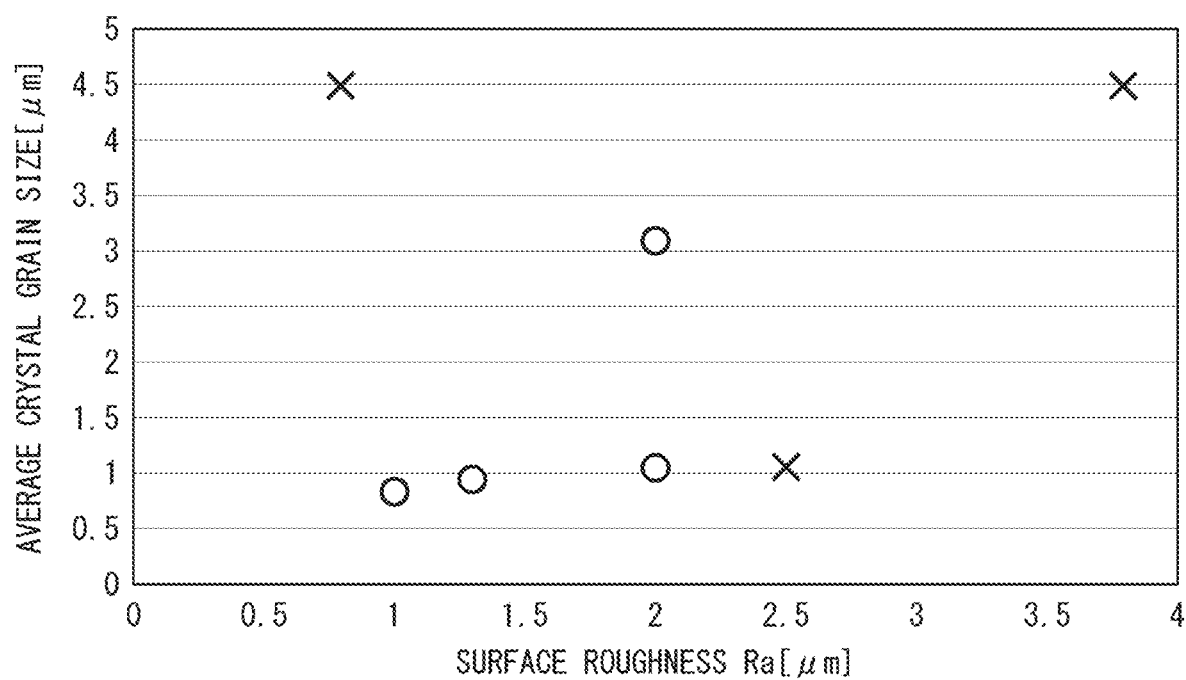
FIG. 3 is a graph showing results of tensile tests with respect to a surface roughness and the average crystal grain size of examples and comparative examples.

As shown in Table 1 and FIG. 3, the surface roughness Ra of the plating layer was in a range of 1.0 to 2.0 μm, the average crystal grain size of the plating layer (the average crystal grain size of the "entire" plating layer) was in a range of 0.86 to 3.05 μm, and accordingly, an oxide superconducting wire having excellent tensile strength was obtained. It is considered that cracks were generated, since the surface roughness Ra of the plating layer is too large in the samples 1 and 4 and the average crystal grain size of the plating layer is too large in the samples 4 and 5.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

10 . . . Oxide superconducting wire
11 . . . Base material
12 . . . First main surface of base material
13 . . . Second main surface of base material
14 . . . Oxide superconducting layer
15 . . . Superconductor laminate 16 . . . Plating layer
17 . . . Outer surface of plating layer
18 . . . Inner surface of the plating layer.

What is claimed is:

1. An oxide superconducting wire comprising:
   a base material;
   a superconductor laminate including an oxide superconducting layer on at least one surface of the base material; and
   a plating layer that is formed by plating and that functions as a stabilizing layer of the superconductor laminate, wherein
   a surface roughness Ra of the plating layer is in a range from 1.0 to 2.0 μm,
   an entire average crystal grain size of the plating layer is in a range from 0.86 to 3.05 μm, and
   an average crystal grain size of the plating layer on a side adjacent to the superconductor laminate is smaller than an average crystal grain size of the plating layer on a side apart from the superconductor laminate, and the side apart from the superconductor laminate is a portion closer to an outer surface of the plating layer where cracks are generated easier by applying a tensile force than a portion closer to an inner surface of the plating layer.

2. The oxide superconducting wire according to claim 1, wherein the average crystal grain size is obtained by an arithmetic mean of:
   a first average crystal grain size measured in a range from 10% to 20% of a thickness of the plating layer from a side close to an inner surface that is adjacent to the superconductor laminate,
   a second average crystal grain size measured in a range from 45% to 55% of the thickness of the plating layer from the side close to the inner surface, and
   a third average crystal grain size measured in a range from 80% to 90% of the thickness of the plating layer from the side close to the inner surface.

3. The oxide superconducting wire according to claim 2, wherein the first average crystal grain size is smaller than the second average crystal grain size, and
   the second average crystal grain size is smaller than the third average crystal grain size.

4. The oxide superconducting wire according to claim 3, wherein
   the first average crystal grain size is 0.68 μm or more and 2.75 μm or less,
   the second average crystal grain size is 0.87 μm or more and 3.00 μm or less, and
   the third average crystal grain size is 0.88 μm or more and 3.40 μm or less.

5. The oxide superconducting wire according to claim 1, wherein a tensile force of the oxide superconducting wire is 500 MPa or more.

* * * * *